United States Patent
Kushnir et al.

(10) Patent No.: US 8,515,366 B2
(45) Date of Patent: Aug. 20, 2013

(54) ACCURATE TRANSMIT POWER MEASUREMENT

(75) Inventors: Igal (Yehuda) Kushnir, Azur (IL); Shaul Klein, Magal (IL)

(73) Assignee: Provigent Ltd., Herzliya (IL)

(*) Notice: Subject to any disclaimer, the term of this patent is extended or adjusted under 35 U.S.C. 154(b) by 202 days.

(21) Appl. No.: 13/177,571

(22) Filed: Jul. 7, 2011

(65) Prior Publication Data
US 2013/0012148 A1    Jan. 10, 2013

(51) Int. Cl.
H04B 1/04 (2006.01)
H03C 1/62 (2006.01)

(52) U.S. Cl.
USPC ............ 455/127.1; 455/115.1; 455/115.3

(58) Field of Classification Search
USPC ............ 455/110, 108, 114.2, 114.3, 117, 455/118, 126, 127.1–127.3, 234.1, 240.1, 455/255–260, 115.1, 115.3; 330/290, 291
See application file for complete search history.

(56) References Cited

U.S. PATENT DOCUMENTS

| | | | | |
|---|---|---|---|---|
| 5,867,777 A * | 2/1999 | Yamaji et al. | | 455/234.1 |
| 6,006,079 A * | 12/1999 | Jaffee et al. | | 455/310 |
| 8,165,540 B2 * | 4/2012 | Lang | | 455/117 |
| 2008/0129610 A1 * | 6/2008 | Tsfati et al. | | 343/702 |
| 2011/0007843 A1 * | 1/2011 | Khorram et al. | | 375/302 |

* cited by examiner

*Primary Examiner* — Andrew Wendell
*Assistant Examiner* — Maryam Soltanzadeh
(74) *Attorney, Agent, or Firm* — Sterne, Kessler, Goldstein & Fox P.L.L.C.

(57) ABSTRACT

A method for power measurement includes applying a non-linear function to a Radio Frequency (RF) signal that includes a modulated component and a spurious component, so as to produce a broadband signal that includes a Direct-Current (DC) component, a baseband component and one or more High-Frequency (HF) components. The broadband signal is Band-Pass (BP) filtered so as to produce a bandpass signal from which the DC and HF components are removed. Based on the bandpass signal, a power of the modulated component in the RF signal is estimated irrespective of the spurious component.

16 Claims, 2 Drawing Sheets

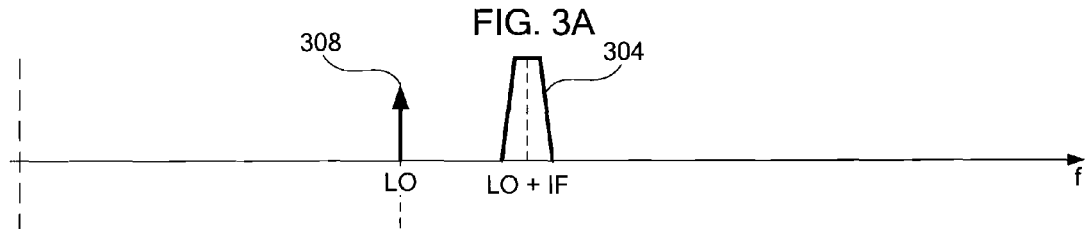
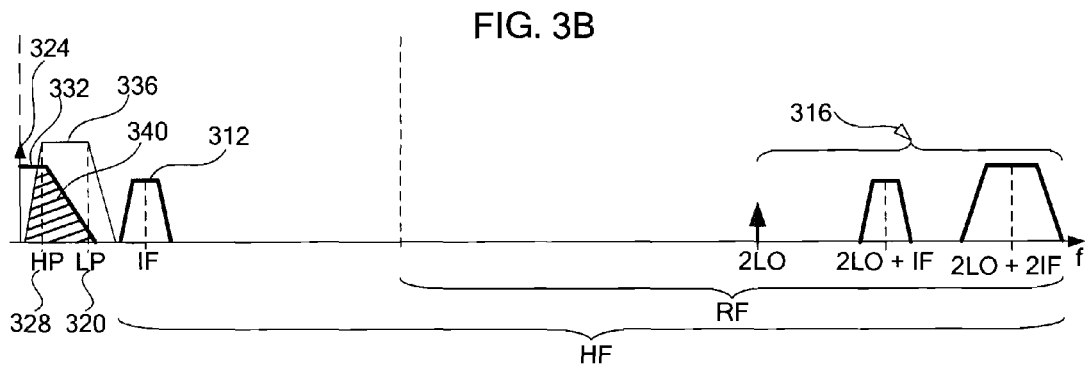
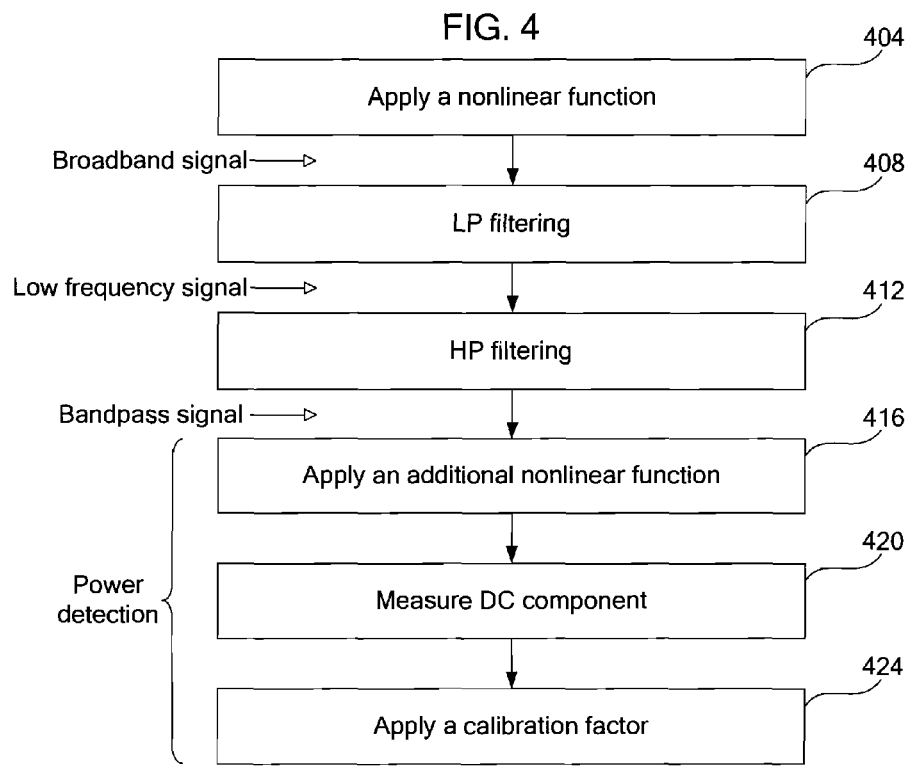

US 8,515,366 B2

ACCURATE TRANSMIT POWER MEASUREMENT

FIELD OF THE INVENTION

The present invention relates generally to power measurement techniques, and particularly to methods and systems for measuring signal power at the output of power amplifiers.

BACKGROUND OF THE INVENTION

Radio Frequency (RF) transmitters commonly measure the signal power at the transmitter output. Some applications require highly accurate power measurement, for example in order to meet wireless standards or regulatory requirements.

The present invention will be more fully understood from the following detailed description of the embodiments thereof, taken together with the drawings in which:

BRIEF DESCRIPTION OF THE DRAWINGS

FIGS. 3A and 3B are spectral diagrams showing signal spectra in a transceiver front end, in accordance with an embodiment of the present invention; and FIG. 4 is a flow chart that schematically illustrates a method for power measurement, in accordance with an embodiment of the present invention.

DETAILED DESCRIPTION OF EMBODIMENTS

Overview

Figure 1:
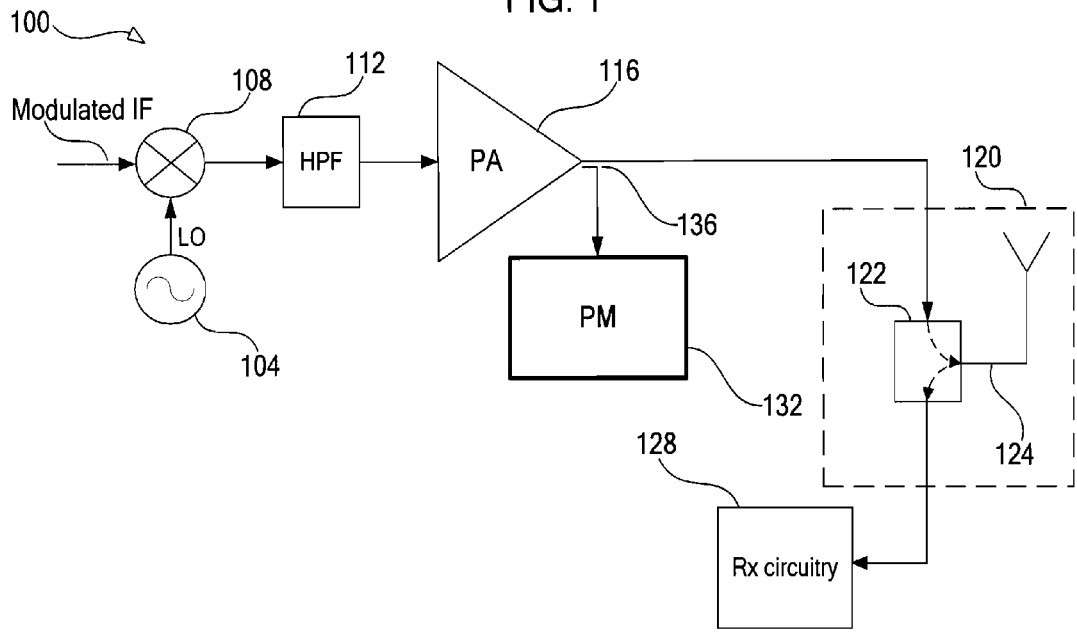
FIG. 1 is a block diagram that schematically illustrates a transceiver front end, in accordance with an embodiment of the present invention.

The present disclosure provides improved methods and systems for accurately measuring a power of a Radio Frequency (RF) signal at an output of a Power Amplifier (PA) in a RF transmitter. In some transmitters, a spectral content of the RF signal at the PA output may comprise a spurious component. When an accurate measurement of the PA output power is required, the spurious component may induce an intolerable error. Such spurious component may result, for example, from leakage of a Local Oscillator (LO) signal through an upconverter that precedes the PA. In some particular embodiments the RF signal is fed from the PA output to an antenna subsystem, where the RF signal is filtered and then provided to the antenna for transmission. Measuring power within the antenna subsystem is typically a complex and inconvenient operation, and therefore measuring at the PA output is preferred. The spurious component level at the PA output, however, is relatively high. The above-described measurement error could be decreased by using sharp RF filtering of the PA output signal, or by down-conversion and baseband processing. These solutions, however, tend to be complex and expensive.

The disclosed techniques significantly diminish the measurement error of the RF signal at the PA output using an especially low cost implementation. In some embodiments, the RF signal is sampled (e.g., using a directional coupler) at or near the output of the PA. A nonlinear element applies a nonlinear function to the sampled signal so as to produce a broadband signal that comprises the following spectral components: a DC component, a baseband component, an Intermediate Frequency (IF) component and some RF components. The baseband component is proportional to the modulated component and is not affected by the spurious component, while the other components are affected by the spurious.

In some embodiments, the broadband signal is Band Pass (BP) filtered, e.g., using a combination of a Low-Pass Filter (LPF) and a High-Pass Filter (HPF), so as to filter out the spectral components of the broadband signal besides the baseband component, thus producing a bandpass signal. In other words, the BP filtering removes the DC and HF components, leaving substantially the baseband component of the signal.

A Power Detector (PD) then produces a resulting DC level out of the bandpass component, wherein this DC level approximates the power of the modulated component. In typical embodiments the PD comprises an additional nonlinear element, an additional LPF and a calibration factor. The calibration factor is typically adapted to the spectral form of the modulated component, however it does not depend on the spurious level since the baseband component is independent of the spurious.

The methods and systems described herein provide highly-accurate output power measurements in the presence of a strong undesired spurious signal. These techniques are particularly effective when the transmitted signal is subject to power control. In such embodiments, the signal power may vary over a large dynamic range, while the spurious signal power (e.g., LO leakage) is typically constant. When the transmitted signal power is low, the spurious signals become dominant, and effective isolation of the desired signal using the disclosed techniques becomes more important. Moreover, the disclosed configurations can be implemented using a small number of low-cost components, and as such reduce the transmitter cost and size.

System Description

FIG. 1 is a block diagram that schematically illustrates a RF transceiver front end 100, in accordance with an embodiment of the present invention. A transceiver front end of this sort can be used, for example, in a transceiver that is part of a microwave or millimeter-wave communication link, or in any other suitable communication system. In the described embodiment a local oscillator 104 upconverts a modulated IF signal by means of a mixer 108. A HPF 112 removes an unwanted image spectral component at (LO−IF) frequency and transfers a modulated RF component at frequency (LO+IF) to a PA 116. However, the RF signal at the PA input comprises also a LO component, commonly named "spurious", which leaks through mixer 108. PA 116 amplifies the RF signal at the HPF output, including the LO spurious, and conveys the amplified RF signal to an antenna subsystem 120.

The antenna subsystem comprises a diplexer 122 and an antenna 124. The diplexer comprises specific Band Pass Filters (BPFs) for the transmit and for the receive frequency bands of the transceiver. The diplexer thus allows for connecting both PA 116 and a receiving circuitry 128 of the transceiver to the same antenna. In some embodiments the RF transceiver comprises a LPF instead of HPF 112 and thus transmits the modulated RF signal at frequency (LO−IF). In these embodiments too, the LO signal may leak through mixer 108 and appear as an undesired spurious signal at the PA input. However, the present description holds for both embodiment versions. In some embodiments, instead of diplexer 122, antenna subsystem 120 comprises a Transmit/

Receive (T/R) switch (not shown) that connects the antenna alternately to PA 116 and to receiving circuitry 128.

A Power Meter (PM) 132 is connected to the output of PA 116 via a directional coupler 136. The purpose of PM 132 is to provide an accurate estimation of the modulated RF component power at antenna 124 input, wherein the LO spurious is significantly suppressed due to the filtering effect of diplexer 122. PM 132 is connected to the PA output rather than to the diplexer output because connecting to the diplexer within the antenna subsystem is often inconvenient, while a monitoring point at coupler 136 output is often provided as an integral part of the PA. However, the LO spurious that is comprised within the RF signal at the PA output may induce a measurement error of about 0.5 dB, or even higher—such as when the level of the modulated RF component is low. As will be explained in detail below, PM 132 is configured to significantly diminish the effect of the LO component at the PA output on the measured power.

Power Meter Structure

Figure 2:
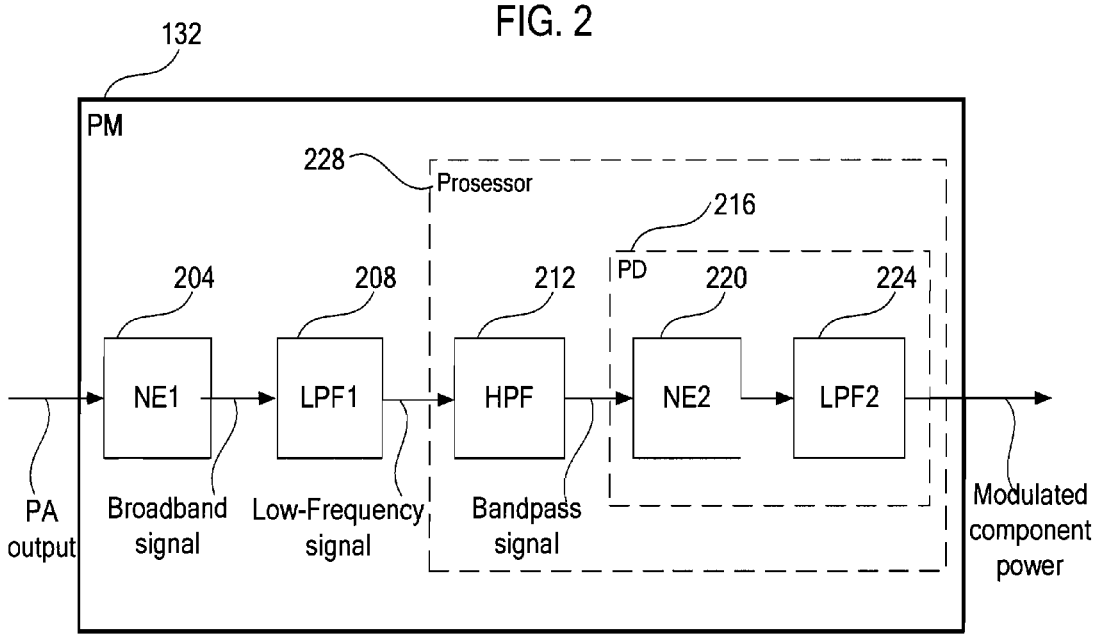
FIG. 2 is a block diagram that schematically illustrates an apparatus for power measurement, in accordance with an embodiment of the present invention.

FIG. 2 is a block diagram that schematically illustrates PM 132, in accordance with an embodiment of the present invention. A Nonlinear Element that is depicted NE1 204 applies a nonlinear function to the RF signal that PM 132 monitors. In some embodiments NE1 comprises a square-law diode. In alternative embodiments NE1 comprises either a full wave rectifier, a half wave rectifier or any other suitable nonlinear element. NE1 204 produces a broadband signal, which comprises a wide range of spectral components from DC to RF. Examples of these signal components are shown and discussed in detail in FIGS. 3A and 3B below. A LPF denoted LPF1 208 filters out High-Frequency (HF) components of a broadband signal that it receives from NE1 204. A HPF 212 filters out a DC component that is comprised in a low-frequency signal at LPF1 208 output. HPF 212 output comprises a bandpass signal whose magnitude is proportional to the modulated component PA 116 output and is independent of the LO spurious.

A Power Detector (PD) 216 processes the bandpass signal as follows: PD 216 comprises an additional nonlinear element, which is depicted NE2 220 in FIG. 2. Like NE1, NE2 may comprise either a square-law diode, a full wave rectifier, a half wave rectifier or any other suitable nonlinear element. An additional LPF, denoted LPF2 224, filters NE2 output signal to produce a DC level that is proportional to the power level of the modulated component at PA 116 output. In some embodiments, PD 216 further applies a calibration factor to the DC level so that the resulting DC level approximates a spurious free value of the modulated component power. The calibration factor may depend, for example, on a spectral shape of the modulated component, on coupler 136 attenuation and on the actual level difference that exists between the coupler output and the PD output.

In some embodiments, NE1 comprises a square-law element. The amplitude of the resulting bandpass signal is proportional to the power of the modulated component. In this case NE2 is configured to comprise a rectifying element, whose output DC level is proportional to the amplitude of the bandpass signal, hence it is also proportional to the power of the modulated component.

In alternative embodiments NE1 comprises a rectifying element. The power of the resulting bandpass signal is proportional to the power of the modulated component. In this case NE2 comprises a square-law element, whose output DC level is proportional to the power of the bandpass signal, hence it is also proportional to the power of the modulated component.

In some embodiments NE1 and LPF1 are implemented by means of discrete components or other suitable analog hardware, while the other functional blocks, i.e., HPF 212 and PD 216, are implemented by means of a digital processor 228. In some embodiments, the functions of processor 228 are implemented in software running on a suitable processor. In alternative embodiments, some or all of the functions of processor 228 can be implemented in hardware, such as using one or more Field-Programmable Gate Arrays (FPGAs) or Application-Specific Integrated Circuits (ASICs), or using a combination of hardware and software elements.

In some embodiments, processor 228 comprises a general-purpose computer, which is programmed in software to carry out the functions described herein. The software may be downloaded to the computer in electronic form, over a network, for example, or it may, alternatively or additionally, be provided and/or stored on non-transitory tangible media, such as magnetic, optical, or electronic memory. In alternative embodiments, NE2 220 and LPF2 224 may also be implemented using discrete components or other analog hardware elements.

In some embodiments, HPF 212 has a certain transfer function or impulse response, and applying HPF 212 comprises applying this transfer function to the low-frequency signal, e.g., by convolution. In alternative embodiment, the function of HPF 212 can be carried out by any other suitable DC removal scheme. For example, processor 228 may calculate the arithmetic mean of the low-frequency signal, and then subtract this mean from the signal. Both embodiments can be implemented using analog and/or digital circuitry, or in software.

The configuration of PM 132 shown in FIG. 2 is an example configuration, which is chosen purely for the sake of conceptual clarity. In alternative embodiments, any other suitable PM configuration can also be used. For example, LPF1 208 and HPF 212 can be implemented using a single BPF. PM elements that are not mandatory for understanding the disclosed techniques were omitted from the figure for the sake of clarity.

Spectral Diagrams

FIGS. 3A and 3B are spectral diagrams that further clarify the operation principles of PM 132, in accordance with an embodiment of the present invention. FIG. 3A illustrates a RF spectrum at PA 116 output. The modulated RF component around LO+IF is depicted 304. The LO spurious is depicted 308. FIG. 3B illustrates an overall spectrum of the broadband signal at the output of NE1 204. Spectral components 312 and 316 illustrate IF and RF components of the broadband signal, respectively. (The broadband signal may also comprise higher-order RF components, which are not shown in the figure.)

Components 312 and 316 compose the HF range that is filtered out by LPF1 208, whose cutoff frequency is denoted LP 320. The DC component of the broadband signal is denoted 324 and is filtered out by HPF 212, whose cutoff frequency is denoted HP 328. The baseband component of the broadband signal is denoted 332. The HP and LP cutoff frequencies form together a Band Pass Filter (BPF) that is denoted 336 in FIG. 3B. The spectral shape of the resulting bandpass signal (at the output of LPF1 208) is illustrated by a hashed area 340. In typical embodiments HP 328 frequency tends to zero, hence nearly the entire baseband component 332 passes through filters LPF1 and HPF. Thus, the bandpass signal is typically very close to the baseband signal. This property is illustrated in FIG. 3B wherein the spectral shape of hashed area 340 is identical to the shape of the baseband component 332.

As explained above, PD 216 calculates the power of the bandpass signal whose spectrum is illustrated by hashed area 340. As can be appreciated, the power of this bandpass signal is unaffected by the LO spurious component.

It should be clarified that in typical embodiments the filters that are described in the present disclosure do not entirely remove the filtered out components, as illustrated in FIG. 3B for the sake of clarity only. This non-ideality of practical filters induces some implementation error within the measured power, which is, however, much smaller than the spurious affect that is diminished by the disclosed technique. In the context of the present patent application and in the claims, terms such as "a signal from which a given component is removed" or "a signal from which a given component is filtered out" do not necessarily mean that the component in question is completely removed from the signal. Suppression of the component in question by a factor that is sufficient for accurate power measurement, e.g., by a factor of 15 dB or more, is also considered "removing" or "filtering out" the component. Other suppression factors, depending on the specific application, may also qualify as "removing" or "filtering out" the component in question.

Method for Accurate Power Measurement

FIG. 4 is a flow chart that schematically illustrates a spurious free power measurement method, in accordance with an embodiment of the present invention. The method begins with a nonlinearity application step 404, in which nonlinear element NE1 204 applies a nonlinear function to the RF signal at the output of PA 116, wherein the RF signal comprises a modulated component and a leaked spurious component. The spectral content of the resulting broadband signal comprises the DC component, the baseband component and the high frequency components that are described above, wherein the baseband component is not affected by the spurious.

At a LP filtering step 408 the high frequency components are filtered out by LPF1 208, to produce a low-frequency signal. At a HP filtering step 412 the DC component is filtered out by HPF 212, to produce a bandpass signal. The bandpass signal typically comprises the baseband component of the broadband signal and is independent of the spurious.

The method ends with steps 416, 420 and 424 that comprise detecting the power of the modulated component by producing a resulting DC level that approximates that power. At an additional nonlinearity application step 416 nonlinear element NE2 220 applies an additional nonlinear function, this time to the bandpass signal at the input of processor 228. At a DC measurement step 420, LPF2 224 applies an additional LP filtering, this time to NE2 output, while the cutoff frequency of the additional LP filtering typically tends to zero. Calibration step 424 comprises applying a calibration factor to the measured DC to produce a resulting DC level that approximates the modulated component power.

PM 132 typically outputs the estimated power of the modulated component to a controller of transceiver 100 (not shown). The transceiver may use the estimated power for any suitable purpose, such as for accurate power setting or power control that meet equipment specifications or regulatory requirements.

The embodiments described herein refer mainly to filtering the signal, following the non-linear operation, using a combination of a HPF that removes HF components and a LPF that removes the DC component. In alternative embodiments, however, the signal filtering may be carried out using suitable Band-Pass Filtering (BPF) circuitry. Although the embodiments described herein mainly address power measurement of a RF signal at a PA output, the methods and systems described herein can also be used in other power measurement applications, such as in test equipment.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for power measurement, comprising:
    applying a nonlinear function to a Radio Frequency (RF) signal that comprises a modulated component and a spurious component, so as to produce a broadband signal that comprises a Direct-Current (DC) component, a baseband component and one or more High-Frequency (HF) components;
    Band-Pass (BP) filtering the broadband signal so as to produce a bandpass signal from which the DC and HF components are removed; and
    based on the bandpass signal, estimating a power of the modulated component in the RF signal irrespective of the spurious component.

2. The method according to claim 1, wherein BP filtering the broadband signal comprises Low-Pass (LP) filtering the broadband signal so as to produce a low-frequency signal from which the HF components are filtered out, and High-Pass (HP) filtering the low-frequency signal so as to produce the bandpass signal from which the DC component is removed.

3. The method according to claim 2, wherein HP filtering the low-frequency signal comprises preserving the entire baseband component.

4. The method according to claim 2, wherein HP filtering the low-frequency signal and estimating the power of the modulated component comprise applying digital processing to the low-frequency signal.

5. The method according to claim 1, wherein estimating the power of the modulated component comprises estimating a DC level of the bandpass signal, which is indicative of the power of the modulated component.

6. The method according to claim 1, wherein estimating the power of the modulated component comprises applying an additional nonlinear function and subsequently a Low-Pass (LP) filtering function to the bandpass signal.

7. The method according to claim 1, wherein estimating the power of the modulated component comprises applying a predefined calibration factor to the estimated power.

8. An apparatus for power measurement, comprising:
    a nonlinear element, which is configured to apply a nonlinear function to a Radio Frequency (RF) signal that comprises a modulated component and a spurious component so as to produce a broadband signal that comprises a Direct-Current (DC) component, a baseband component and one or more High-Frequency (HF) components;

Band-Pass (BP) filtering circuitry, which is configured to BP filter the broadband signal so as to produce a bandpass signal from which the DC and HF components are removed; and a Power Detector (PD), which is configured to estimate a power of the modulated component in the RF signal irrespective of the spurious component by processing the bandpass signal.

9. The apparatus according to claim 8, wherein the BP filtering circuitry comprises:

a Low-Pass Filter (LPF), which is configured to filter the broadband signal so as to produce a low-frequency signal from which the HF components are filtered out; and a High-Pass Filter (HPF), which is configured to filter the low-frequency signal so as to produce the bandpass signal from which the DC component is removed.

10. The apparatus according to claim 9, wherein the HPF is configured to preserve the entire baseband component.

11. The apparatus according to claim 9, wherein the HPF and the PD are implemented by a digital processor.

12. The apparatus according to claim 8, wherein the PD is configured to estimate the power of the modulated component in the RF signal by estimating a DC level of the bandpass signal, which is indicative of the power of the modulated component.

13. The apparatus according to claim 8, wherein the PD comprises an additional nonlinear element that is configured to apply an additional nonlinear function to the bandpass signal, and a Low-Pass Filter (LPF) that is configured to filter the bandpass signal after processing by the additional nonlinear element.

14. The apparatus according to claim 8, wherein the PD is configured to apply a predefined calibration factor to the estimated power.

15. A transmitter, comprising:

a Power Amplifier (PA), which is configured to amplify a Radio Frequency (RF) signal that comprises a modulated component and a spurious component; and a Power Measurement (PM) unit, which is configured to apply a nonlinear function to the amplified RF signal so as to produce a broadband signal that comprises a Direct-Current (DC) component, a baseband component and one or more High-Frequency (HF) components, to Band-Pass (BP) filter the broadband signal so as to produce a bandpass signal from which the DC and HF components are removed, and to estimate a power of the modulated component in the RF signal irrespective of the spurious component by processing the bandpass signal.

16. The transmitter according to claim 15, wherein the PM unit comprises:

a Low-Pass Filter (LPF), which is configured to filter the broadband signal so as to produce a low-frequency signal from which the HF components are filtered out; and a High-Pass Filter (HPF), which is configured to filter the low-frequency signal so as to produce the bandpass signal from which the DC component is removed.

* * * * *